United States Patent
Wang et al.

(10) Patent No.: US 7,990,296 B1
(45) Date of Patent: Aug. 2, 2011

(54) HIGH SPEED LOW POWER CELL PROVIDING SERIAL DIFFERENTIAL SIGNALS

(75) Inventors: Heng Wang, Shenzhen (CN);
Hongming An, San Diego, CA (US);
CongQing Xiong, Shenzhen (CN)

(73) Assignee: SMSC Holdings S.a.r.l., Luxembourg (LU)

( * ) Notice: Subject to any disclaimer, the term of this patent is extended or adjusted under 35 U.S.C. 154(b) by 0 days.

(21) Appl. No.: 12/721,418

(22) Filed: Mar. 10, 2010

(51) Int. Cl.
*H03M 9/00* (2006.01)

(52) U.S. Cl. .......... 341/101; 341/100; 341/141; 326/38; 326/115; 327/108; 327/144; 327/407

(58) Field of Classification Search .......... 341/100, 341/101, 141; 326/36, 115; 327/106, 144, 327/407
See application file for complete search history.

(56) References Cited

U.S. PATENT DOCUMENTS

| | | | | |
|---|---|---|---|---|
| 5,396,236 A * | 3/1995 | Ueda | ............................... | 341/50 |
| 5,726,990 A * | 3/1998 | Shimada et al. | ............. | 370/536 |
| 6,188,339 B1 * | 2/2001 | Hasegawa | ..................... | 341/101 |
| 6,614,371 B2 * | 9/2003 | Zhang | ............................ | 341/101 |
| 7,006,021 B1 * | 2/2006 | Lombaard | ..................... | 341/100 |
| 7,135,899 B1 * | 11/2006 | Sancheti et al. | ............. | 327/144 |
| 7,298,301 B2 * | 11/2007 | Zhang | ............................ | 341/101 |
| 7,796,063 B2 * | 9/2010 | Kim et al. | ...................... | 341/100 |
| 7,804,431 B1 * | 9/2010 | Bourstein et al. | ............. | 341/100 |
| 2003/0016148 A1 * | 1/2003 | Zhang | ............................ | 341/101 |
| 2008/0055126 A1 * | 3/2008 | Dudha et al. | .................. | 341/100 |
| 2009/0309771 A1 * | 12/2009 | Yamaguchi | ................... | 341/101 |
| 2010/0302081 A1 * | 12/2010 | Sugawara et al. | ............. | 341/101 |

* cited by examiner

*Primary Examiner* — Linh V Nguyen

(57) ABSTRACT

Techniques are provided to serialize and delay parallel input data signals and are particularly useful for low power applications. In one example, a device includes a plurality of data input ports adapted to receive N parallel single-ended input data signals, and a clock input port adapted to receive a clock signal substantially synchronized with the parallel single-ended input data signals. The device also includes a cell adapted to serialize the parallel single-ended input data signals to provide N/2 first serial differential output data signals in response to the clock signal, delay the parallel single-ended input data signals, and serialize the delayed parallel single-ended input data signals to provide N/2 delayed second serial differential output data signals in response to the clock signal. The delayed second serial differential output data signals are delayed relative to the first serial differential output data signals. The device also includes a plurality of output ports.

23 Claims, 5 Drawing Sheets

HIGH SPEED LOW POWER CELL PROVIDING SERIAL DIFFERENTIAL SIGNALS

BACKGROUND

1. Technical Field

Embodiments of the present disclosure generally relate to electronic circuitry and more particularly, to circuitry for providing serial differential signals.

2. Related Art

Universal serial bus (USB) is a popular and widely used protocol that has been adopted for communications between computers and peripheral devices. A new USB 3.0 protocol has been developed that may be used to support high speed data transfer rates for high bandwidth applications such as digital video delivery and display, external media devices such as Blu-Ray drives, personal computers and server market applications, external HDD storage, and other applications.

For example, the USB 3.0 protocol can support data transfer rates of 5 Gbps (e.g., over 10 times faster than the USB 2.0 protocol). However, circuits used to support fast serial data transfer rates often have high power requirements which can significantly hinder the implementation of such devices.

SUMMARY

In accordance with various embodiments described herein, various techniques may be used to serialize and delay parallel input data signals for high speed and low power applications. In one embodiment, a device includes a plurality of data input ports adapted to receive N parallel single-ended input data signals. The device also includes a clock input port adapted to receive a clock signal substantially synchronized with the parallel single-ended input data signals. The device also includes a cell adapted to serialize the parallel single-ended input data signals to provide N/2 first serial differential output data signals in response to the clock signal, delay the parallel single-ended input data signals, and serialize the delayed parallel single-ended input data signals to provide N/2 delayed second serial differential output data signals in response to the clock signal. The delayed second serial differential output data signals are delayed relative to the first serial differential output data signals. The device also includes a plurality of output ports adapted to pass the first serial differential output data signals and the delayed second serial output data signals.

In another embodiment, a method includes receiving N parallel single-ended input data signals; receiving a clock signal substantially synchronized with the parallel single-ended input data signals. The method also includes serializing the parallel single-ended input data signals to provide N/2 first serial differential output data signals in response to the clock signal. The method also includes delaying the parallel single-ended input data signals. The method also includes serializing the delayed parallel single-ended input data signals to provide N/2 second serial differential output data signals in response to the clock signal. The delayed second serial differential output data signals are delayed relative to the first serial differential output data signals. The method also includes passing the first serial differential output data signals and the delayed second serial output data signals.

In another embodiment, a device includes means for receiving N parallel single-ended input data signals; means for receiving a clock signal substantially synchronized with the parallel single-ended input data signals. The device also includes means for serializing the parallel single-ended input data signals to provide N/2 first serial differential output data signals in response to the clock signal. The device also includes means for delaying the parallel single-ended input data signals. The device also includes means for serializing the delayed parallel single-ended input data signals to provide N/2 second serial differential output data signals in response to the clock signal. The delayed second serial differential output data signals are delayed relative to the first serial differential output data signals. The device also includes means for passing the first serial differential output data signals and the delayed second serial output data signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

Embodiments of the present disclosure are directed to high speed and low power differential cell and signal delay circuitry that may support design requirements for protocols having fast data transfer rates. For example, certain embodiments are provided with circuitry that may be used to convert a plurality of parallel single-ended data signals into a serial differential data signal accompanied by another serial differential data signal that may be delayed, for example, by one bit or multiple bits. Such a delayed signal may be used, for example, for de-emphasis processing of encoded data.

Various embodiments further described herein may be implemented to provide features including, for example, operating a clock signal at a rate that is approximately half the data rate of a serial differential data signal which may directly drive a data driver for its differential operation. Such features may be especially advantageous in low power implementations using high speed protocols such as USB 3.0.

Figure 1:
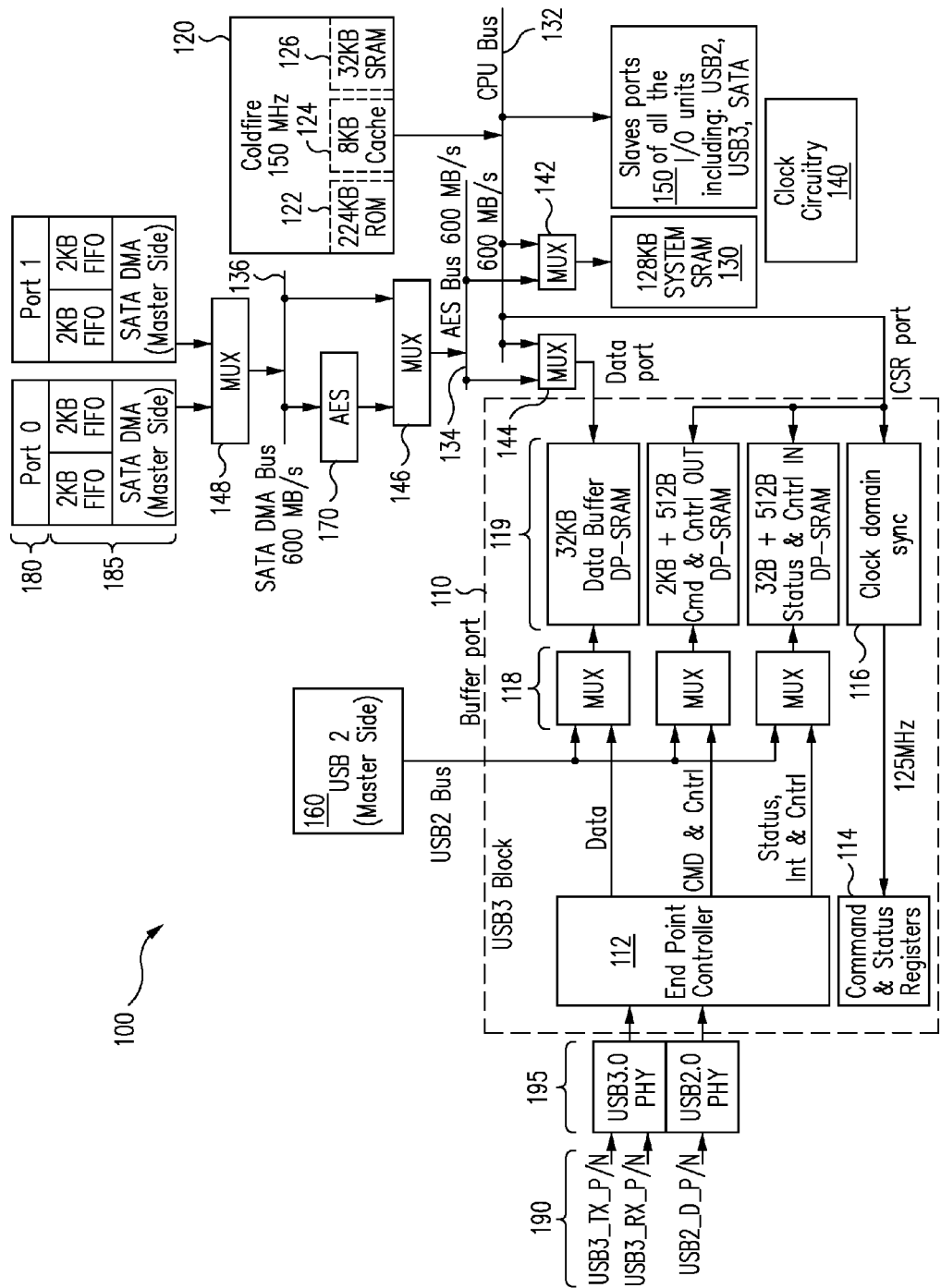
FIG. 1 illustrates a block diagram of a system which may be used to interface with a variety of different devices over various ports in accordance with an embodiment of the present invention.

FIG. 1 illustrates a block diagram of a system 100 which may be used to interface with a variety of different devices over various ports. In one embodiment, system 100 may be implemented as a system on a chip that manages communications between a host device and one or more other devices. For example, system 100 may be used to provide bridging, hosting, and/or hub operations in accordance with various communication protocols.

System 100 includes a device controller 110, a processor 120, system memory 130, clock circuitry 140, slave ports 150, a configuration port 160, an encryption block 170, communication ports 180, physical layer components 185, communication ports 190, and physical layer components 195.

As shown in FIG. 1, system 100 includes various busses 132, 134, and 136, and multiplexers 142, 144, 146, and 148 to facilitate communications between device controller 110, processor 120, system memory 130, slave ports 150, encryption block 170, physical layer components 185, and physical layer components 195.

Device controller 110 may be configured to manage communications to and from physical layer components 195 associated with communication ports 190. For example, device controller 110 may be used to host one or more devices connected to communication ports 190. In one embodiment, device controller 110 may be implemented as a universal serial bus (USB) controller configured to permit system 100 to operate as a USB host to one or more USB slave devices connected to communication ports 190. As shown in FIG. 1, device controller 110 includes an end point controller 112, command and status registers 114, a clock domain synchronization block 116, multiplexers 118, and various memory blocks and buffers 119.

Processor 120 may be implemented, for example, as a Coldfire processor operating at 150 MHz with various associated memories and caches 122, 124, and 126. Processor 120 may be used, for example, to perform various bridging, hosting, and/or hub operations for communications exchanged between communication ports 180 and 190 as well as slave ports 150.

System memory 130 may be used by processor 120 and/or other components of system 100 to support the various operations of system 100. Clock circuitry 140 may be used to provide one or more clock signals to system 100. Slave ports 150 may be used to interface system 100 with various types of slave devices as may be desired in various implementations. Configuration port 160 may be implemented, for example, as a USB 2.0 port used to configure system 100 for desired operations. Encryption block 170 may be implemented, for example, to perform Advanced Encryption Standard (AES) encryption on data passed between communication ports 180 and the rest of system 100.

Communication ports 180 may be implemented, for example, as storage media device ports configured to support communications with storage media devices such as hard drives, flash drives (e.g., thumb drives, solid state drives, or others), optical storage media (e.g., CD-ROM, DVD, HD-DVD, Blu-Ray, or others), or other appropriate storage media devices. Such storage media device ports may be implemented in accordance with Serial Advanced Technology Attachment (SATA) interfaces, external SATA (eSATA) interfaces, Parallel Advanced Technology Attachment (PATA) interfaces, flash memory interfaces, or others. In the embodiment shown in FIG. 1, communication ports 180 are implemented as SATA interfaces. Physical layer components 185 may be used to facilitate communications between communication ports 180 and the rest of system 100.

Communication ports 190 may be implemented, for example, in accordance with various communication standards such as, for example, USB 3.0, USB 2.0, Firewire (e.g., IEEE 1394), or others. In the embodiment shown in FIG. 1, communication ports 190 are implemented as USB 2.0 and USB 3.0 ports. Physical layer components 195 may be used to facilitate communications between communication ports 190 and the rest of system 100.

In one embodiment, an external host device may be connected to one of communication ports 190. In this embodiment, system 100 may be configured to host one or more devices connected to communication ports 180 and/or 190 on behalf of the host device. In this regard, system 100 may facilitate communications between the host device and/or the various hosted devices.

In one embodiment, physical layer components 195 may include various components and related circuitry to support high speed and low power parallel to serial signal conversion operations and signal delay operations further described herein.

Figure 2:
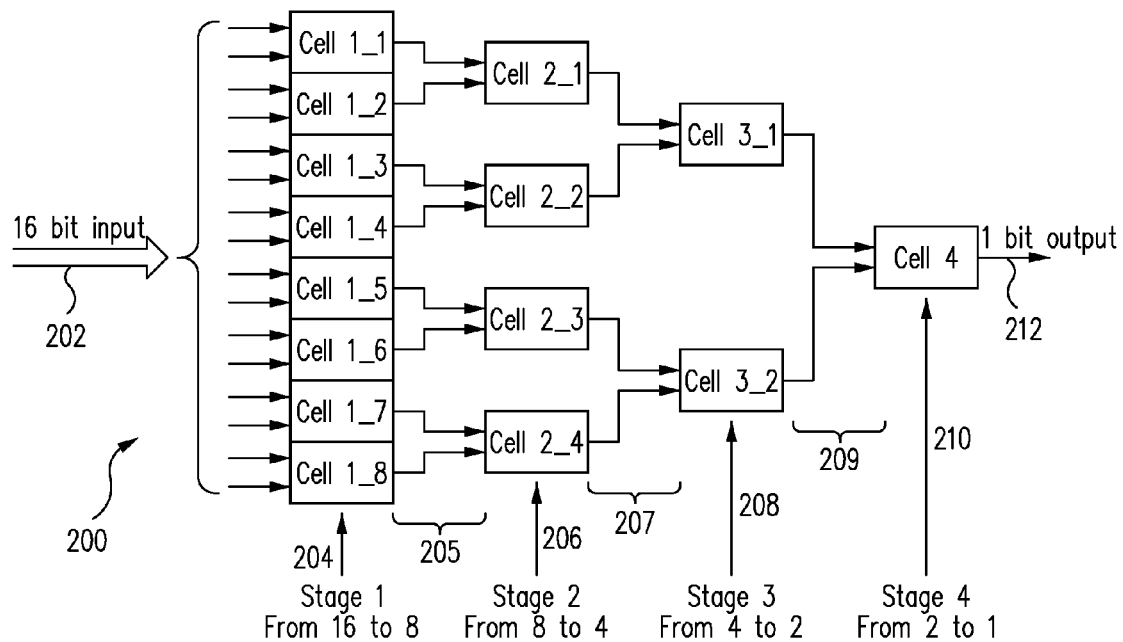
FIG. 2 illustrates a system including a plurality of stages implemented with a plurality of cells in accordance with an embodiment of the present invention.

FIG. 2 illustrates a system 200 including a plurality of stages implemented with a plurality of cells in accordance with an embodiment of the present invention. Each cell of system 200 may be used, for example, to convert parallel single-ended input data signals into serial differential output data signals. For example, in one embodiment, each cell of FIG. 2 may selectively switch between passing one of two signals received by the cell to provide a serial output signal.

As shown in FIG. 2, system 200 includes a stage 204 having a plurality of cells 1_1 through 1_8 for serializing from 16 to 8 bits, a stage 206 having a plurality of cells 2_1 through 2_4 for serializing from 8 to 4 bits, a stage 208 having cells 3_1 through 3_2 for serializing from 4 to 2 bits, and a stage 210 having a cell 4 for serializing from 2 to 1 bit.

As further shown in FIG. 2, parallel single-ended input data signals 202 (16 bits) are provided to stage 204 wherein they are serialized to provide signals 205 (8 bits) output by cells 1_1 to 1_8. In turn, signals 205 are provided to stage 206 wherein they are serialized to provide signals 207 (4 bits) output by cells 2_1 to 2_4. Next, signals 207 are provided to stage 208 wherein they are serialized to provide signals 209 (2 bits) output by cells 3_1 and 3_2. Finally, signals 209 are provided to stage 210 wherein they are serialized to provide signal 212 (1 bit) output by cell 4.

Figure 3:
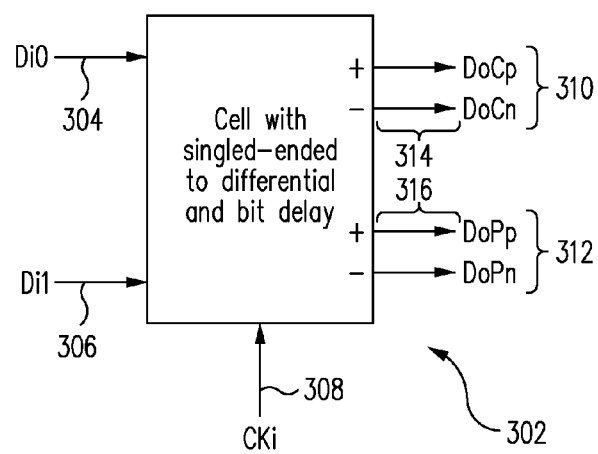
FIG. 3 illustrates a cell configured to convert parallel single-ended input data signals into one or more serial differential output data signals in accordance with an embodiment of the present invention.

FIG. 3 illustrates a cell 302 configured to convert parallel single-ended input data signals into one or more serial differential output data signals in accordance with an embodiment of the present invention. In various embodiments, cell 302 may be used to implement any of the cells included in any of stages 204 through 210 of system 200 of FIG. 2.

Cell 302 includes data input ports 304 and 306 adapted to receive two parallel single-ended input data signals Di0 and Di1. Signals Di0 and Di1 may have data bits encoded therein. In other embodiments, input data signals may have data bytes or words encoded therein.

Cell 302 also includes a clock input port 308 adapted to receive a clock signal CKi. Clock signal CKi may be substantially synchronized with signals Di0 and Di1. Cell 302 is also adapted to serialize signals Di0 and Di1 into a serial differential output data signal 310 (implemented by complementary signals DoCp and DoCn), and into a delayed serial differential output data signal 312 (implemented by complementary signals DoPp and DoPn) in response to clock signal CKi. In an embodiment, cell 302 is adapted to switch, in response to clock signal CKi, between passing signal Di0 and passing signal Di1 to provide signal 310 which includes the data bits encoded in each of signals Di0 and Di1. Cell 302 may similarly provide signal 312. In one embodiment, signal 312 includes the same data bits as signal 310, but delayed relative to signal 310 by one data bit which also corresponds to one half period (e.g., one half clock cycle) of clock signal CKi. Cell 302 also includes output ports 314 and 316 adapted to output (e.g., pass) signals 310 and 312.

In one or more embodiments, signals 310 and 312 may operate at approximately twice the rate of clock signal CKi. In this regard, clock signal CKi may be implemented to support data rates for different communication protocols, such as USB 2.0 and USB 3.0. For example, in an embodiment, clock signal CKi may operate at approximately 2.5 GHz to support an output data rate of approximately 5 GHz for signals 310 and 312.

Figure 4:
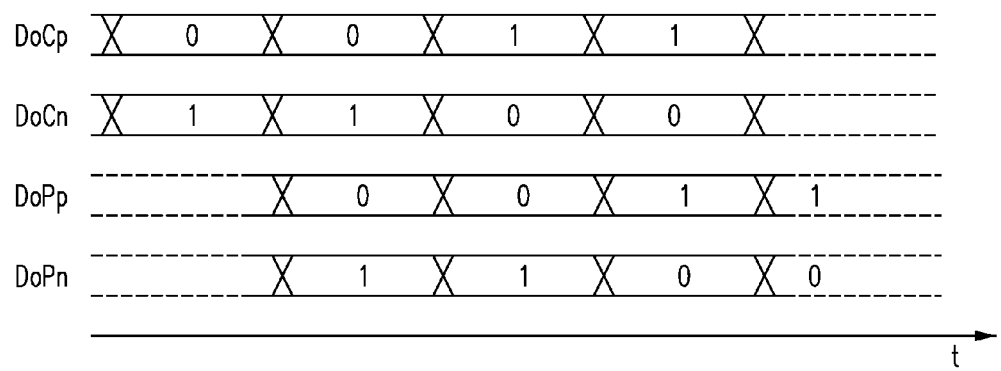
FIG. 4 illustrates a timing diagram for signals identified in FIG. 3 in accordance with an embodiment of the present invention.

FIG. 4 illustrates a timing diagram for signals identified in FIG. 3 in accordance with an embodiment of the present invention. Signal DoCp may start with a logic value of 0, at which time, signal DoCn has a logic value of 1 for a clock signal cycle along a time "t" axis. When signal DoCp has a logic value of 1, signal DoCn has a logic value of 0. Signal DoPp has the same logic values as signal DoCp, except that signal DoPp is delayed by, for example, one bit. Signal DoPn has the same logic values as signal DoCn, except that signal DoPn is delayed by, for example one bit.

Figure 5:
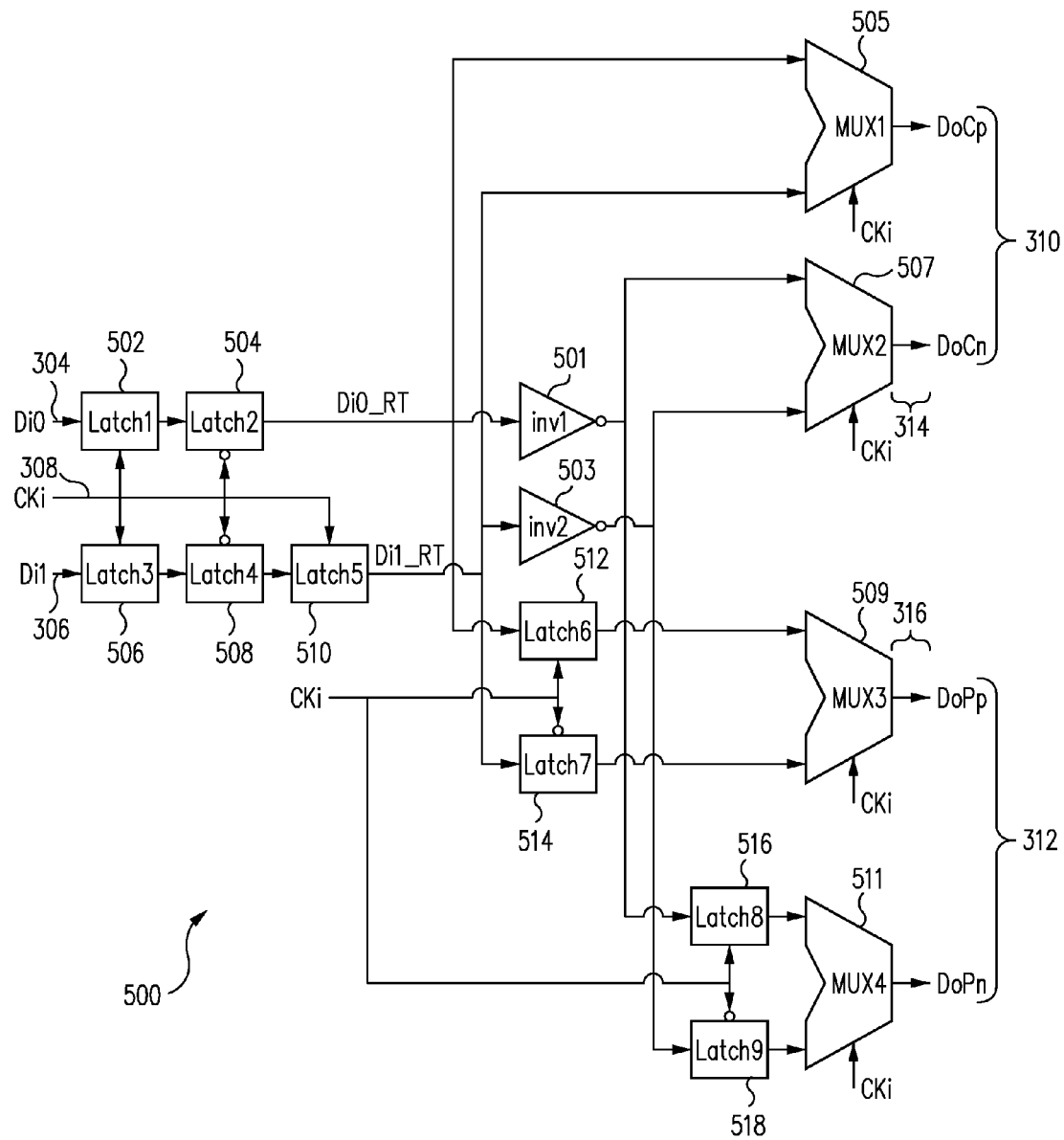
FIG. 5 illustrates a circuit which may be used to implement the cell of FIG. 3 in accordance with an embodiment of the present invention.

FIG. 5 illustrates a circuit 500 which may be used to implement cell 302 of FIG. 3 in accordance with an embodiment of the present invention. Circuit 500 may be used to implement cell 302 of FIG. 3 according to an embodiment. As shown in FIG. 5, circuit 500 includes latches 502, 504, 506, 508, 510, 512, 514, 516, and 518, inverters 501 and 503, and multiplexers 505, 507, 509, and 511.

In one or more embodiments, the latches may be configured to perform latching (e.g., sampling) operations in response to rising and falling edges of clock signal CKi. As a result, signals (e.g., encoded data bits) may be passed through each latch in approximately one half period of clock signal CKi (e.g., each latch may delay a signal passing through the latch by approximately one half period of clock signal CKi).

In one or more embodiments, multiplexers 505, 507, 509, and 511 may be configured to switch in response to rising and falling edges of clock signal CKi. For example, multiplexers 505, 507, 509, and 511 may select a first input in response to a rising edge of clock signal CKi, and may select a second input in response to a falling edge of clock signal CKi. As a result, multiplexers 505, 507, 509, and 511 may pass two data bits during each period of clock signal CKi (e.g., a data bit from a first input may be passed in response to the rising edge of clock signal CKi, and a data bit from a second input may be passed in response to the falling edge of clock signal CKi). Thus, each of multiplexers 505, 507, 509, and 511 may be used to effectively serialize two parallel data signals to provide a single serial data signal.

By operating the latches and multiplexers of FIG. 5 in response to rising and falling edges of clock signal CKi, clock signal CKi may be implemented with a frequency of approximately half the data rate of serial differential output data signals 310 and 312. For example, in one embodiment, signals 310 and 312 may be implemented as USB 3.0 signals operating at approximately 5 GHz and clock signal CKi may operate at approximately 2.5 GHz. Such an implementation may advantageously reduce the power requirements of circuit 500 while still supporting high speed data rates. Such power savings can be particularly significant in embodiments wherein a plurality of cells 302 implemented with circuit 500 are used in a plurality of stages, such as in system 200 of FIG. 2.

As shown in FIG. 5, signals Di0 and Di1 are received by circuit 500. Signal Di0 is passed through a series of latches 502 and 504 where it is re-timed using clock signal CKi to provide signal Di0_RT. Signal Di1 is passed through a series of latches 506, 508, and 510 where it re-timed using clock signal CKi to provide signal Di1_RT. In this regard, it will be appreciated that signal Di1_RT may be delayed by one half period of clock signal CKi by passing through an additional latch 510 in comparison with signal Di0_RT. As shown in FIG. 5, signals Di0_RT and Di1_RT are provided to four different branches of circuit 500. In the first branch, signals Di0_RT and Di1_RT are provided to first and second inputs of multiplexer 505, which selectively passes signal Di0_RT or Di1_RT in response to clock signal CKi to provide signal DoCp.

In the second branch, signals Di0_RT and Di1_RT are passed through inverters 501 and 503, respectively, and on to first and second inputs of multiplexer 507, which selectively passes inverted signal Di0_RT or Di1_RT in response to clock signal CKi to provide signal DoCn. As a result, signals DoCp and DoCn collectively provide signal 310 as previously discussed with regard to FIG. 3.

In the third branch, signals Di0_RT and Di1_RT are passed through additional latches 512 and 514, respectively, and on to first and second inputs of multiplexer 509. In this regard, latches 512 and 514 collectively delay signals Di0_RT and Di1_RT by approximately one period of clock signal CKi. The delayed signals Di0_RT and Di1_RT are provided to first and second inputs of multiplexer 509, which selectively passes delayed signal Di0_RT or Di1_RT in response to clock signal CKi to provide signal DoPp.

In the fourth branch, inverted signals Di0_RT and Di1_RT are passed through additional latches 516 and 518, respectively, and on to first and second inputs of multiplexer 511. In this regard, latches 516 and 518 collectively delay inverted signals Di0_RT and Di1_RT by approximately one period of clock signal CKi. The delayed inverted signals Di0_RT and Di1_RT are provided to first and second inputs of multiplexer 511, which selectively passes delayed inverter signal Di0_RT or Di1_RT in response to clock signal CKi to provide signal DoPn. As a result, signals DoPp and DoPn collectively provide signal 312 as previously discussed with regard to FIG. 3.

Figure 6:
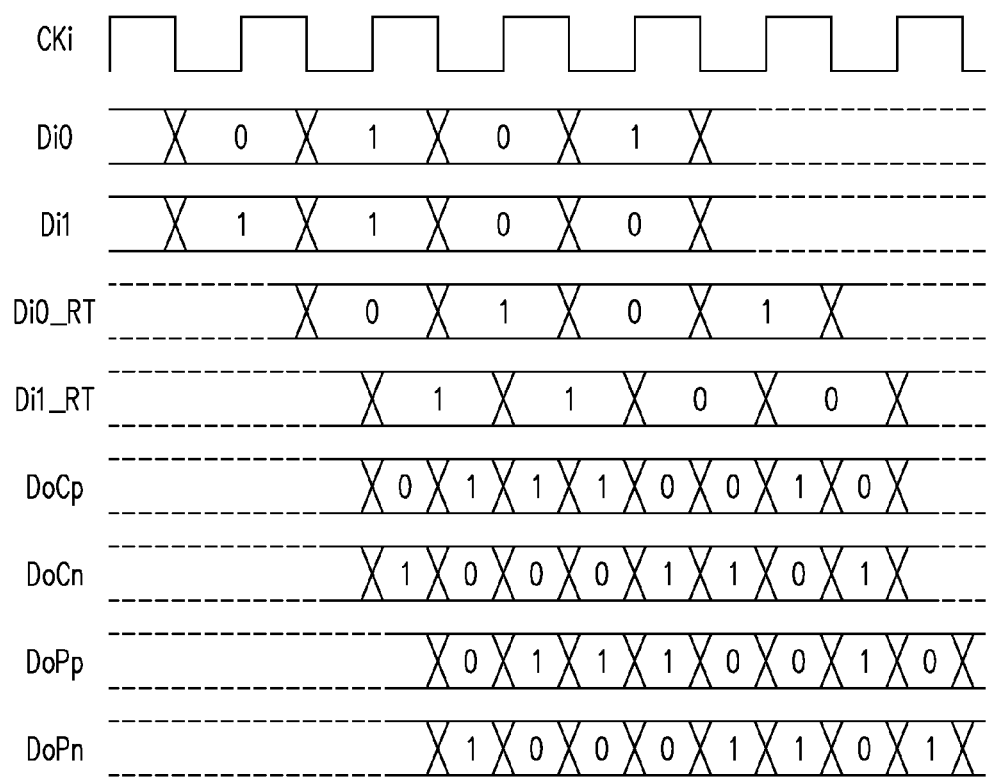
FIG. 6 illustrates a timing diagram for signals identified in FIG. 5 in accordance with an embodiment of the present invention.

FIG. 6 illustrates a timing diagram for signals identified in FIG. 5 in accordance with an embodiment of the present invention. For example, in FIG. 6, signal Di0 has logic values of 0, 1, 0, and 1, and signal Di1 has logic values of 1, 1, 0, and 0.

In FIG. 6, signal Di0_RT has the same logic values as signal Di0, that is, 0, 1, 0, and 1, except that Di0_RT is delayed by 1 bit as a result of passing signal Di0 through latches 502 and 504, each of which may delay signal Di0 by one half period of clock signal CKi.

In FIG. 6, signal Di1_RT has the same logic values as signal Di1, that is, 1, 1, 0, and 0, except that signal Di1_RT is delayed, by one and one half bits in comparison with signal Di1 as a result of passing signal Di1 through latches 506, 508, and 510, each of which may delay signal Di1 by one half period of clock signal CKi.

In FIG. 6, signal DoCp has logic values of 0, 1, 1, 1, 0, 0, 1, and 0, and signal DoCn has complementary logic values of 1, 0, 0, 0, 1, 1, 0, and 1.

In FIG. 6, signal DoPp has the same logic values as DoCp, and signal DoPn has the same logic values as DoCn (which are complementary to the logic values of signal DoPp). However, it will be appreciated that signals DoPp and DoPn are both delayed by one bit relative to signals DoCp and DoCn as a result of passing signals Di0_RT and Di1_RT through additional latches 512 and 514, and passing inverted signals Di0_RT and Di1_RT through additional latches 516 and 518.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A device comprising:
   a plurality of data input ports adapted to receive N parallel single-ended input data signals;
   a clock input port adapted to receive a clock signal substantially synchronized with the parallel single-ended input data signals;
   a cell adapted to serialize the parallel single-ended input data signals to provide N/2 first serial differential output data signals in response to the clock signal, delay the parallel single-ended input data signals, and serialize the delayed parallel single-ended input data signals to provide N/2 delayed second serial differential output data signals in response to the clock signal, wherein the delayed second serial differential output data signals are delayed relative to the first serial differential output data signals; and
   a plurality of output ports adapted to pass the first serial differential output data signals and the delayed second serial output data signals.

2. The device of claim 1, wherein the first and second serial differential output data signals operate at approximately twice a rate of the clock signal.

3. The device of claim 2, wherein the clock signal operates at approximately 2.5 GHz.

4. The device of claim 3, wherein the first serial differential output data signals are universal serial bus (USB) 3.0 signals.

5. The device of claim 1, wherein the delayed second serial differential output data signals are delayed relative to the first serial differential output data signals by one data bit.

6. The device of claim 1, wherein the cell is adapted to switch, in response to the clock signal, between passing data encoded in a first one of the single-ended input data signals and passing data encoded in a second one of the single-ended input data signals to provide at least one of the first serial differential output data signals.

7. The device of claim 6, wherein the cell further comprises:
   first and second multiplexers;
   first and second inverters;
   a first series of latches adapted to pass a first one of the parallel single-ended input data signals to a first input port of the first multiplexer, and through the first inverter to a first input port of the second multiplexer;
   a second series of latches adapted to pass a second one of the parallel single-ended input data signals to a second input port of the first multiplexer, and through the second inverter to a second input port of the second multiplexer; and
   wherein the first and second multiplexers are adapted to switch in response to the clock signal to provide the at least one of the first serial differential output data signals.

8. The device of claim 7, wherein the first series of latches comprises an even number of latches and the second series of latches comprises an odd number of latches.

9. The device of claim 7, wherein the cell further comprises:
   third and fourth multiplexers;
   a first latch adapted to pass the first one of the parallel single-ended input data signals from the first series of latches to a first input port of the third multiplexer;
   a second latch adapted to pass the second one of the parallel single-ended input data signals from the second series of latches to a second input port of the third multiplexer;
   a third latch adapted to pass the first one of the parallel single-ended input data signals from the first inverter to a first input port of the fourth multiplexer;
   a fourth latch adapted to pass the second one of the parallel single-ended input data signals from the second inverter to a second input port of the fourth multiplexer; and
   wherein the third and fourth multiplexers are adapted to switch in response to the clock signal to provide at least one of the delayed second serial differential output data signals.

10. The device of claim 9, wherein each latch is adapted to latch in response to rising and falling edges of the clock signal and is adapted to provide a delay of approximately one half period of the clock signal.

11. The device of claim 1, further comprising a plurality of cells configured in a plurality of stages, wherein each stage is adapted to receive N*M parallel single-ended input data signals and provide N*M/2 first serial differential output data signals in response to the clock signal, wherein N is a number of the parallel single-ended input data signals received by each cell and M is a number of the cells in the stage.

12. A method comprising:
   receiving N parallel single-ended input data signals;
   receiving a clock signal substantially synchronized with the parallel single-ended input data signals;
   serializing the parallel single-ended input data signals to provide N/2 first serial differential output data signals in response to the clock signal;
   delaying the parallel single-ended input data signals;
   serializing the delayed parallel single-ended input data signals to provide N/2 second serial differential output data signals in response to the clock signal, wherein the delayed second serial differential output data signals are delayed relative to the first serial differential output data signals; and
   passing the first serial differential output data signals and the delayed second serial output data signals.

13. The method of claim 12, wherein the first and second serial differential output data signals operate at approximately twice a rate of the clock signal.

14. The method of claim 13, wherein the clock signal operates at approximately 2.5 GHz.

15. The method of claim 14, wherein the first serial differential output data signals are universal serial bus (USB) 3.0 signals.

16. The method of claim 12, wherein the delayed second serial differential output data signals are delayed relative to the first serial differential output data signals by one data bit.

17. The method of claim 12, wherein the serializing the parallel single-ended input data signals comprises switching, in response to the clock signal, between passing data encoded in a first one of the single-ended input data signals and passing data encoded in a second one of the single-ended input data signals to provide at least one of the first serial differential output data signals.

18. The method of claim 17, further comprising:
  passing a first one of the parallel single-ended input data signals through a first series of latches to a first input port of a first multiplexer;
  passing the first one of the parallel single-ended input data signals from the first series of latches through a first inverter to a first input port of a second multiplexer;
  passing a second one of the parallel single-ended input data signals through a second series of latches to a second input port of the first multiplexer;
  passing the second one of the parallel single-ended input data signals from the second series of latches through a second inverter to a second input port of the second multiplexer; and
  wherein the switching comprises switching the first and second multiplexers in response to the clock signal to provide the at least one of the first serial differential output data signals.

19. The method of claim 18, wherein the first series of latches comprises an even number of latches and the second series of latches comprises an odd number of latches.

20. The method of claim 18, further comprising:
  passing the first one of the parallel single-ended input data signals from the first series of latches through a first latch to a first input port of a third multiplexer;
  passing the second one of the parallel single-ended input data signals from the second series of latches through a second latch to a second input port of the third multiplexer;
  passing the first one of the parallel single-ended input data signals from the first inverter through a third latch to a first input port of a fourth multiplexer;
  passing the second one of the parallel single-ended input data signals from the second inverter through a fourth latch to a second input port of the fourth multiplexer; and
  switching the third and fourth multiplexers in response to the clock signal to provide at least one of the delayed second serial differential output data signals.

21. The method of claim 20, further comprising latching each latch in response to rising and falling edges of the clock signal, wherein each latch provides a delay of approximately one half period of the clock signal.

22. The method of claim 12, further comprising:
  receiving N*M parallel single-ended input data signals at each stage of a plurality of stages comprising a plurality of cells; and
  providing from each stage N*M/2 first serial differential output data signals in response to the clock signal, wherein N is a number of the parallel single-ended input data signals received by each cell and M is a number of the cells in the stage.

23. A device comprising:
  means for receiving N parallel single-ended input data signals;
  means for receiving a clock signal substantially synchronized with the parallel single-ended input data signals;
  means for serializing the parallel single-ended input data signals to provide N/2 first serial differential output data signals in response to the clock signal;
  means for delaying the parallel single-ended input data signals;
  means for serializing the delayed parallel single-ended input data signals to provide N/2 second serial differential output data signals in response to the clock signal, wherein the delayed second serial differential output data signals are delayed relative to the first serial differential output data signals; and
  means for passing the first serial differential output data signals and the delayed second serial output data signals.

* * * * *